US010003339B1

United States Patent
Zhu et al.

(10) Patent No.: US 10,003,339 B1
(45) Date of Patent: Jun. 19, 2018

(54) GENERAL PURPOSE INTERFACE CIRCUIT COMPATIBLE WITH OUTPUT OF MIPI SIGNALS

(71) Applicant: GUANGDONG GOWIN SEMICONDUCTOR CORPORATION, LTD., Foshan, Guangdong (CN)

(72) Inventors: Jinghui Zhu, Guangdong (CN); Bin Gao, Guangdong (CN); Chienkuang Chen, Guangdong (CN)

(73) Assignee: GUANGDONG GOWIN SEMICONDUCTOR CORPORATION, LTD., Foshan (CN)

( * ) Notice: Subject to any disclaimer, the term of this patent is extended or adjusted under 35 U.S.C. 154(b) by 0 days. days.

(21) Appl. No.: 15/786,625

(22) Filed: Oct. 18, 2017

Related U.S. Application Data (63) Continuation of application No. PCT/CN2017/090804, filed on Jun. 29, 2017.

(51) Int. Cl.
  *H03K 19/0185* (2006.01)
  *H03K 17/22* (2006.01)
  *H03K 19/177* (2006.01)

(52) U.S. Cl.
  CPC ... *H03K 19/018507* (2013.01); *H03K 17/223* (2013.01); *H03K 19/177* (2013.01)

(58) Field of Classification Search
  None
  See application file for complete search history.

(56) References Cited

U.S. PATENT DOCUMENTS

| | | | | |
|---|---|---|---|---|
| 7,619,448 | B2 * | 11/2009 | Wu | H03F 1/0205 |
| | | | | 326/121 |
| 9,319,043 | B2 * | 4/2016 | Voutilainen | H03K 17/16 |
| 9,513,655 | B1 * | 12/2016 | Liu | G05F 5/00 |
| 2012/0307122 | A1 * | 12/2012 | Liu | G05F 1/56 |
| | | | | 348/332 |

* cited by examiner

*Primary Examiner* — Minh D A
*Assistant Examiner* — James H Cho (57) ABSTRACT

A GPIO interface circuit compatible with output of MIPI signals, comprises a first CMOS signal output module (10), an LVDS signal output module (30), a second CMOS signal output module (20). When an MIPI output enable input of the LVDS signal output module (30) is enabled and output enable inputs of the first and second CMOS signal output modules (10, 20) are both disabled, a first and second pull-down modules (40, 50) are in active state accordingly, and the LVDS signal output module (30) outputs a current signal to the first or second pull-down module (40, 50) to ensure voltage of the first or second signal output be a preset voltage, which can achieve MIPI HS Mode output.

18 Claims, 5 Drawing Sheets

GENERAL PURPOSE INTERFACE CIRCUIT COMPATIBLE WITH OUTPUT OF MIPI SIGNALS

CROSS-REFERENCE TO RELATED APPLICATIONS

The present application is a Continuation Application of PCT application No. PCT/CN2017/090804 filed on Jun. 29, 2017, the contents of which are hereby incorporated by reference.

FIELD OF THE INVENTION

The present invention relates to the technical field of interface circuits, and more particularly to a general purpose interface circuit compatible with output of MIPI signals.

BACKGROUND OF THE INVENTION

In the field of integrated circuit design, the IO (Input/Output) interface circuit is a circuit module used for realizing communication between chips.

When two or more chips are communicating with one another, the GPIO (General Purpose Input/Output) interface circuit is generally used for communication between chips. The GPIO interface circuit is characterized by being compatible with various voltages and transmission logics, which is usually compatible with voltages such as 1.2V/1.5V/1.8V/2.5V/3.3V and so on, and with transmission of CMOS (Complementary Metal Oxide Semiconductor) signals and LVDS (Low Voltage Differential Signaling) signals and so on.

Figure 1:
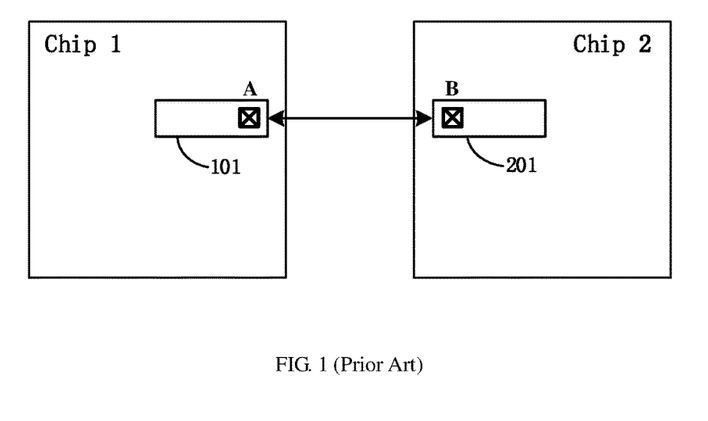
FIG. 1 is a circuit diagram of a single-end interface which is one type of CMOS signal interface according to the prior art.
Figure 2:
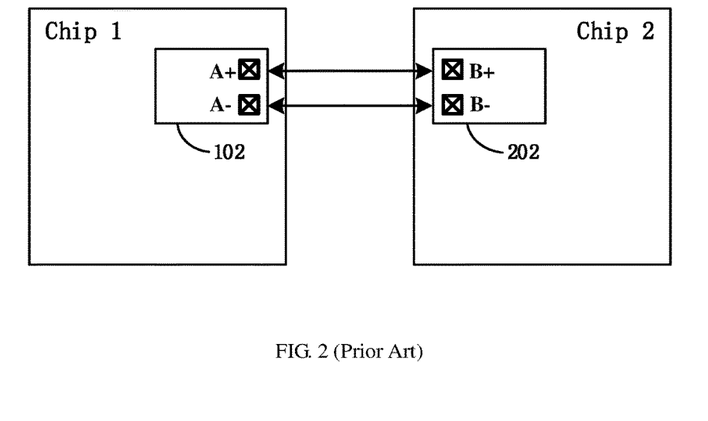
FIG. 2 is a circuit diagram of a differential interface which is another type of CMOS signal interface according to the prior art.

The CMOS signal interface includes the single-end interface and the differential interface. The single-end interface transmits signals using a single wire connected with two terminals, which is characterized by defining data 0 or data 1 according to different signal voltages. As shown in FIG. 1, when a chip 1 communicates with a chip 2, a terminal A of an interface 101 is connected to a terminal B of an interface 201. When the terminal A transmits data 1 to the terminal B, it transmits a high level voltage to the terminal B; and when the terminal A transmits date 0 to the terminal B, it transmits a low level voltage to the terminal B. The differential interface transmits signals using two wires respectively connected with two pairs of terminals, which is characterized by defining data 0 or data 1 according to voltage difference between two terminals. As shown in FIG. 2, when the chip 1 communicates with the chip 2, terminals A+ and A− of an interface 102 are respectively connected to terminals B+ and B− of an interface 202. When the interface 102 transmits data 1 to the interface 102, the terminal A+ transmits a high level voltage to the terminal B+ and the terminal A− transmits a low level voltage to the terminal B−; and when the interface 102 transmits data 0 to the interface 102, the terminal A+ transmits a low level voltage to the terminal B+ and the terminal A− transmits a high level voltage to the terminal B−. Compared with the single-end interface, the differential interface has a better transmission performance and a higher transmission speed.

The LVDS interface is a high speed differential interface characterized by transmitting current signals via the interface and usually used for transmitting high speed data signals such as HD video signals.

The MIPI (Mobile Industry Processor Interface) is a low-voltage and low-power interface initiated by MIPI alliance, which is an open standard and specification for mobile application processors. As a mainstream high speed image transmission interface used in mobile devices, the MIPI has been widely used in various fields such as smartphones, tablet computers, wearable devices and virtual reality devices, etc.

The MIPI is also a differential interface, which defines data 0 or data 1 by voltage difference between two terminals. The MIPI includes HS Mode (High Speed mode) and LP Mode (Low Power mode). In HS Mode, the transmission speed can reach up to 500 MHz or even more. The definition of MIPI HS Mode of is shown in table 1 with the basis features of a transmit high level voltage ranging from 300 mV to 400 mV, a transmit low level voltage ranging from 0V to 100 mV, an average value of 200 mV between the high and low level voltages in standard condition, a fluctuation interval ranging from 150 mV to 250 mV for the average value, a voltage difference of 200 mV between the high and low level voltages in standard condition, and a fluctuation interval ranging from 140 mV to 270 mV for the voltage difference.

TABLE 1

Definition of MIPI HS Mode

| Parameter | Description | Min | Nom | Max | Units | Notes |
|---|---|---|---|---|---|---|
| $V_{CMTX}$ | HS transmit static common-mode voltage | 150 | 200 | 250 | mV | 1 |
| $|\Delta V_{CMTX(1,0)}|$ | $V_{CMTX}$ mismatch when output is Differential-1 or Differential-0 | | | 5 | mV | 2 |
| $|V_{OD}|$ | HS transmit differential voltage | 140 | 200 | 270 | mV | 1 |
| $|\Delta V_{OD}|$ | $V_{OD}$ mismatch when output is Differential-1 or Differential-0 | | | 10 | mV | 2 |
| $V_{OHHS}$ | HS output high voltage | | | 360 | mV | 1 |
| $Z_{OS}$ | Single ended output impedance | 40 | 50 | 62.5 | Ω | |
| $\Delta Z_{OS}$ | Single ended output impedance mismatch | | | 10 | % | |

The definition of MIPI LP Mode is shown in table 2, which defines the differential output interface LCMOS12 (the interface outputs a 1.2V differential voltage in form of CMOS logic).

TABLE 2

Definition of MIPI LP Mode

| Parameter | Description | Min | Nom | Max | Units | Notes |
|---|---|---|---|---|---|---|
| $V_{OH}$ | Thevenin output high level | 1.1 | 1.2 | 1.3 | V | |
| $V_{OL}$ | Thevenin ouput low level | −50 | | 50 | mV | |
| $Z_{OLP}$ | Output impedence of LP transmitter | 110 | | | Ω | 1, 2 |

Figure 3:
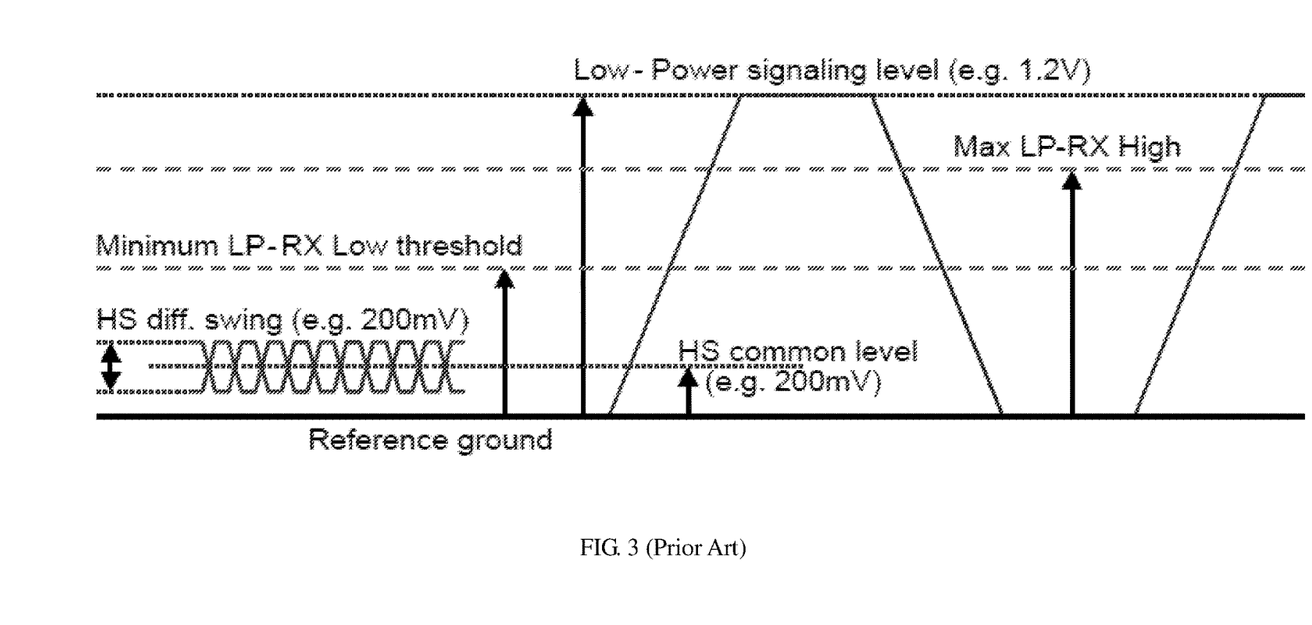
FIG. 3 illustrates a signal diagram of the MIPI in HS Mode and LP Mode respectively according to the prior art.

FIG. 3 illustrates a signal diagram of the MIPI in HS Mode and LP Mode respectively. As shown in FIG. 3, the amplitude of the signal level ranges from 100 mV to 300 mV in HS Mode, and the amplitude of the signal level ranges from 0V to 1.2V in LP Mode.

With the rapid development of the mobile electronic devices, the MIPI is widely used as a new high speed interface for mobile devices. Especially, the MIPI output interface is widely used for image acquisition, transmission and display.

Figure 4:
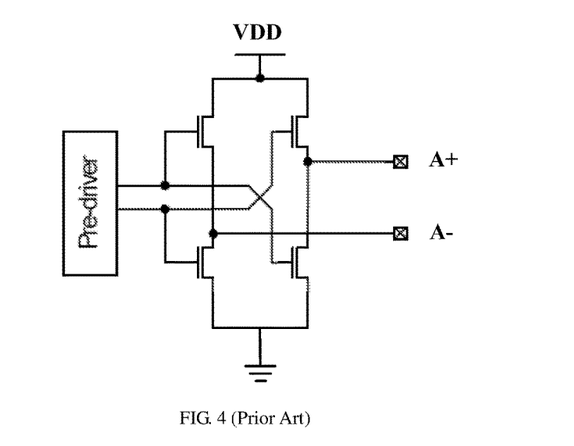
FIG. 4 is a circuit diagram of an MIPI output interface according to the prior art.
Figure 5:
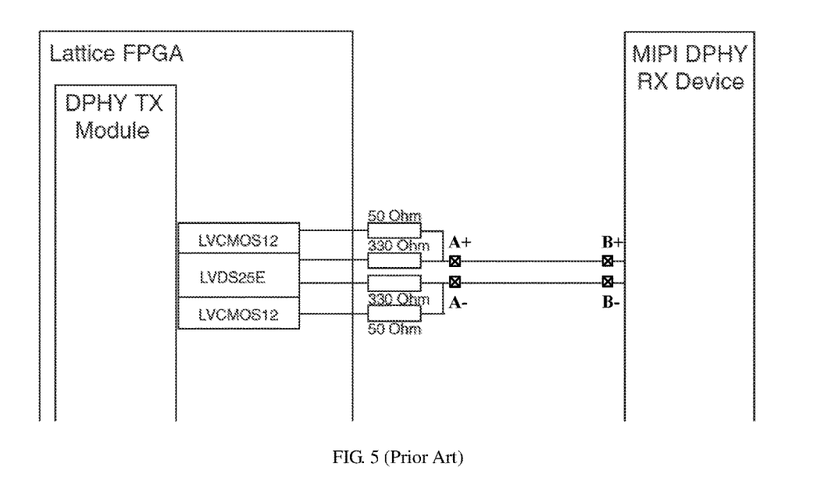
FIG. 5 is a circuit diagram of an FPGA which uses differential interfaces LVDS25E and LVCMOS12 to simulate the MIPI output interface according to the prior art.

The existing MIPI output interfaces can be divided into two types. One type is a single MIPI output interface circuit as shown in FIG. 4, in which a single pair of MIPI circuits are designed in the chip and only used for transmission of MIPI signals. As shown in FIG. 5, the other type uses a differential output interface LVDS25E, a pair of differential output interface LVCMOS12 and off-chip resistors to emulate MIPI output transmission. In this solution, two pairs of interface circuits are used (one pair of LVDS25E output interfaces and one pair of LVCMOS12 differential output interfaces) so as to be compatible with MIPI outputs. However, the output speed of this solution is limited by LVDS25E output speed.

In conclusion, the existing single GPIO cannot be compatible with MIPI output interface in the prior art.

SUMMARY OF THE INVENTION

The objective of the present invention is to provide a GPIO interface circuit compatible with output of MIPI signals to solve the problem that the existing GPIO interface circuits cannot be compatible with MIPI output interface in the prior art.

A GPIO interface circuit compatible with output of MIPI signals is provided in the present invention, which comprises a first CMOS signal output module having an output enable input and a data input; an LVDS signal output module having an LVDS output enable input, an MIPI output enable input and a data input; a second CMOS signal output module having an output enable input and a data input; a first pull-down module; and a second pull-down module; the data input of the first CMOS signal output module is connected to the data input of the LVDS signal output module; a signal output of the first CMOS signal output module is connected to a first signal output of the LVDS signal output module; a signal output of the second CMOS signal output module is connected to a second signal output of the LVDS signal output module; the MIPI output enable input is connected to a control terminal of the first pull-down module and a control terminal of the second pull-down module respectively; a signal input of the first pull-down module is connected to the first signal output of the LVDS signal output module; a signal output of the first pull-down module is grounded; a signal input of the second pull-down module is connected to the second signal output of the LVDS signal output module; and a signal output of the second pull-down module is grounded; when the MIPI output enable input of the LVDS signal output module is enabled and output enable inputs of the first and second CMOS signal output modules are both disabled, the first and second pull-down modules are in active state accordingly, and the LVDS signal output module outputs a current signal to the first or second pull-down module according to a logic control signal inputted into the data input of the LVDS signal output module to ensure voltages of the first and second signal outputs be preset voltages respectively.

The GPIO interface circuit compatible with output of MIPI signals is provided in the embodiments of the present invention. The MIPI output enable input is defined on the LVDS signal output module and meanwhile the first and second signal outputs are respectively defined on the first and second pull-down modules. When the MIPI output enable input of the LVDS signal output module is enabled and output enable inputs of the first and second CMOS signal output modules are both disabled, the first and second pull-down modules are in active state accordingly, and the LVDS signal output module outputs the current signal to the first or second pull-down module according to a logic control signal inputted into the data input of the LVDS signal output module to ensure the voltage of the first or second signal output be a preset voltage. It can achieve the MIPI HS Mode output using the LVDS signal output module, which solves the problem that the existing general purpose interface circuits cannot be compatible with MIPI output interface in the prior art.

BRIEF DESCRIPTION OF THE DRAWINGS

In order that the technical solutions in the embodiments of the present invention may be more clearly illustrated, drawings used in the embodiments or in the prior art will be described briefly. Obviously, the following described drawings represent only some embodiments of the present invention and one of ordinary skill in the art may obtain other drawing(s) without paying creative work.

DETAILED DESCRIPTION OF THE EMBODIMENTS

In order that the objectives, technical solutions and advantages of the present invention may be more clearly understood, the present invention will now be more particularly described with reference to the accompanying drawings. It should be understood that the embodiments described here are for the purpose of illustration and should not limit the present invention.

In order to illustrate the technical solutions of the present invention, the specific embodiments will be described in the following.

Figure 6:
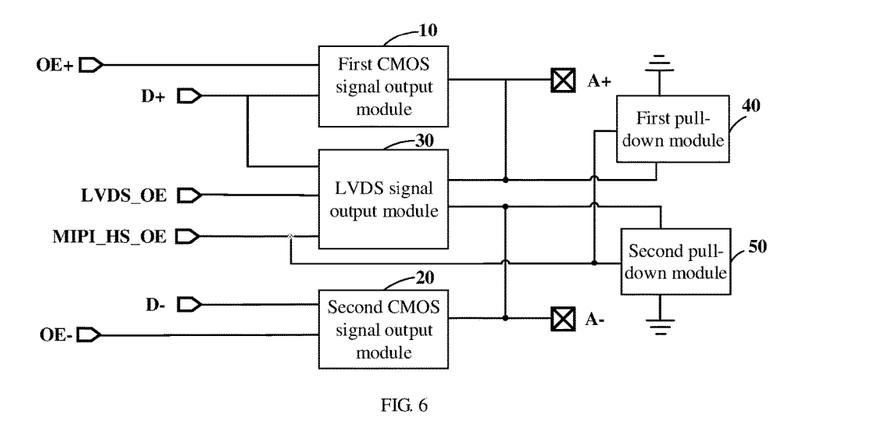
FIG. 6 is a structural diagram of a general purpose interface circuit compatible with output of MIPI signals according to an embodiment of the present invention.

Referring to FIG. 6, a GPIO interface circuit compatible with output of MIPI signals according to an embodiment of the present invention comprises a first CMOS signal output module 10 having an output enable input and a data input; an LVDS signal output module 30 having an LVDS output enable input, an MIPI output enable input and a data input; a second CMOS signal output module 20 having an output enable input and a data input; a first pull-down module 40; and a second pull-down module 50.

The data input of the first CMOS signal output module 10 is connected to the data input of the LVDS signal output module 30. A signal output of the first CMOS signal output module 10 is connected to a first signal output of the LVDS signal output module 30. A signal output of the second CMOS signal output module 20 is connected to a second signal output of the LVDS signal output module 30. The MIPI output enable input is connected to a control terminal of the first pull-down module 40 and a control terminal of the second pull-down module 50 respectively. A signal input of the first pull-down module 40 is connected to the first signal output of the LVDS signal output module 30. A signal output of the first pull-down module 40 is grounded. A signal input of the second pull-down module 50 is connected to the second signal output of the LVDS signal output module 30. A signal output of the second pull-down module 50 is grounded.

When the MIPI output enable input of the LVDS signal output module 30 is enabled and output enable inputs of the first and second CMOS signal output modules 10 and 20 are both disabled, the first and second pull-down modules 40 and 50 are in active state accordingly, and the LVDS signal output module 30 outputs a current signal to the first or second pull-down module 40 or 50 according to a logic control signal inputted into the data input of the LVDS signal output module to ensure voltages of the first and second signal outputs be preset voltages respectively.

Figure 7:
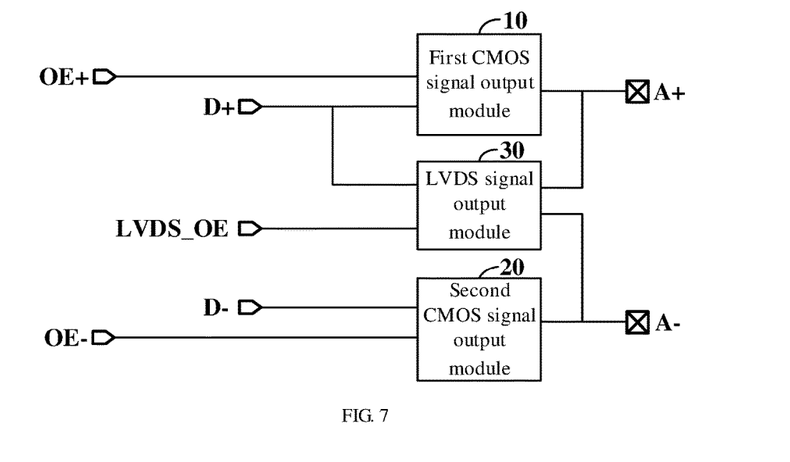
FIG. 7 is a structural diagram of the general purpose interface circuit according to an embodiment of the present invention.

In order to describe the present invention in detail, the circuit structure of an output circuit of the GPIO interface will be illustrated at first. As shown in FIG. 7, the first and second CMOS signal output modules 10 and 20 are configured for outputting CMOS signals, which are compatible with output of 1.2V/1.5V/1.8V/2.5V/3.3V voltages. A high output level of the CMOS signal defines logic 1 while a low output level of the CMOS signal defines logic 0. The output enable input and the data input of the first CMOS signal output module 10 are labeled as OE+ and D+, respectively. The output enable input and the data input of the second CMOS signal output module 20 are labeled as OE− and D−, respectively. The LVDS output enable input of the LVDS signal output module 30 is labeled as LVDS_OE. Output enable of the first CMOS signal output module 10 is controlled according to a high or low level signal inputted into the output enable input OE+ of the first CMOS signal output module 10. Output enable of the second CMOS signal output module 20 is controlled according to a high or low level signal inputted into the output enable input OE− of the second CMOS signal output module 20. For example, when a high level is respectively inputted into the OE+ and OE− and a low level is inputted into the LVDS_OE, the first and second CMOS signal output modules 10 and 20 are output enabled, the data inputted into the input D+ of the first CMOS signal output module 10 is outputted from the output A+, and the data inputted into the input D− of the second CMOS signal output module 20 is outputted from the output A−. At this moment, the LVDS signal output module 30 outputs a high impedance state, which will hence not affect the output signals from the outputs A+ and A− of the first and second CMOS signal output modules 10 and 20. When a low level is respectively inputted into the OE+ and OE−, the first and second CMOS signal output modules 10 and 20 both output a high impedance state. When the first and second CMOS signal output modules 10 and 20 are used for differential CMOS logic output, the OE+ and OE− are both provided with a high level for output enable of the first and second CMOS signal output modules 10 and 20, and the data inputs D+ and D− are provided with reverse data, thus the outputs A+ and A− output reverse data accordingly to achieve differential signal output.

Figure 8:
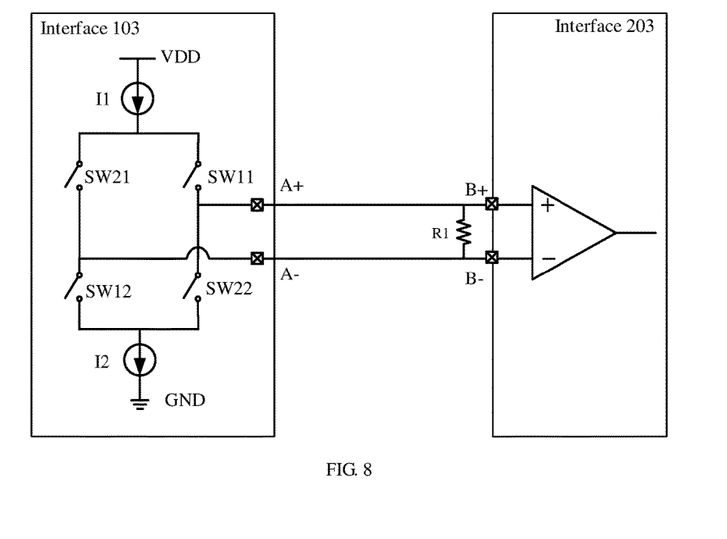
FIG. 8 is a structural diagram of an LVDS signal output module in the general purpose interface circuit compatible with output of MIPI signals according to an embodiment of the present invention.

Regarding the LVDS signal output module 30, LVDS interface circuit is a high speed differential interface characterized by transmitting current signals via the interface and usually used for transmitting high speed data signals such as video signals. Specifically, as shown in FIG. 8, a transmitting terminal of the LVDS interface circuit is an interface 103 with differential output terminals A+ and A− and a receiving terminal of the LVDS interface circuit is an interface 203 with input terminals B+ and B−. Since the LVDS transmitting interface is an interface circuit outputting current, the output source current is I1 and the tail current is I2, and the source current I1 and the tail current I2 are constant currents which both equal to a current value IL. In order to receive the current transmitted from the transmitting terminal, a resistor R1 with resistance RL is connected between the input terminals B+ and B−. When the interface 103 transmits LVDS logic 1 to the interface 203, switches SW11 and SW12 are closed and switches SW21 and SW22 are open, the terminal A+ outputs the source current with the current value IL to the terminal B+, the current passes through the resistor R1, flows back to the terminal A− via the terminal B−, and flows together with the tail current I2 to the ground. In this case, a positive voltage difference is formed between the terminals B+ and B−, which equals to IL*RL, for receiving the LVDS logic 1. When the interface 103 transmits LVDS logic 0 to the interface 203, switches SW21 and SW22 are closed and switches SW11 and SW12 are open, the terminal A− outputs the source current with the current value IL to the terminal B−, the current passes through the resistor R1, flows back to the terminal A+ via the terminal B+, and flows together with the tail current I2 to the ground. In this case, a negative voltage difference is formed between the terminals B+ and B−, which equals to −IL*RL, for receiving the LVDS logic 0.

When the LVDS signal output module 30 receives a logic control signal of logic 1, the terminal A+ outputs the constant current IL which is then inputted into the terminal A−. When the LVDS signal output module 30 receives a logic control signal of logic 0, the terminal A− outputs the constant current IL which is then inputted into the terminal A+. The output enable of the LVDS signal output module 30 is controlled by voltage level inputted into the terminal LVDS_OE. For example, when the terminal LVDS_OE is provided with a high level and the terminals OE+ and OE− are provided with a low level, the LVDS signal output module 30 outputs an LVDS signal, and if the terminal D+ is provided with a logic control signal of logic 1, the terminal A+ outputs the constant current IL which is then inputted into the terminal A−; and if the terminal D+ is provided with a logic control signal of logic 0, the terminal A− outputs the constant current IL which is then inputted into the terminal A+, at this moment, the first and second CMOS signal output modules 10 and 20 output the high impedance state and will hence not affect the LVDS signals outputted from the terminals A+ and A− of the LVDS signal output module 30. When the terminal LVDS_OE is provided with a low level, the LVDS signal output module 30 outputs the high impedance state.

It should be noted that in this GPIO circuit, the first and second CMOS signal output modules 10 and 20 are capable of outputting CMOS signals independently or simultaneously, and the LVDS signal output module 30 is in high impedance state at this moment. When the LVDS signal output module 30 outputs the LVDS signal, the first and second CMOS signal output modules 10 and 20 are both in high impedance state.

In the present invention, the function of MIPI output interface is integrated with the existing GPIO interface circuit having the LVDS output. An MIPI output enable input MIPO_HS_OE is added to the LVDS signal output module 30. The LVDS signal output module 30 is further arranged with a terminal LVDS_OE. The first and second signal outputs of the LVDS signal output module 30 are respectively connected to the first and second pull-down modules 40 and 50 which are further grounded. The difference between the added terminal MIPI_HS_OE and the terminal LVDS_OE is that the added terminal MIPI_HS_OE is further connected to the first and second pull-down modules 40 and 50. When the terminal LVDS_OE is provided with an enable signal, only the LVDS signal output module 30 will be enabled for LVDS output, and the first and second pull-down modules 40 and 50 will not be enabled at this moment. When the terminal MIPI_HS_OE is provided with an enable signal, the LVDS signal output module 30 and the first and second pull-down modules 40 and 50 will be enabled at the same time for MIPI HS Mode output. Therefore, enabling the terminal MIPI_HS_OE is equivalent to enabling the terminal LVDS_OE together with closing the switches of the first and second pull-down modules 40 and 50.

The working principle for making the output voltage of the first signal output be a preset voltage is specified as follows. When the MIPI output enable input of the LVDS signal output module 30 is enabled and output enable inputs of the first and second CMOS signal output modules 10 and 20 are both disabled, the first and second pull-down modules 40 and 50 are in active state accordingly, the LVDS signal output module 30 outputs the current signal to the first pull-down module 40 according to the logic control signal of logic 1 inputted into the data input of the LVDS signal output module 30, the first pull-down module 40 makes the voltage of the first signal output be a first preset voltage according to the current signal, and the second signal output is grounded.

The working principle for making the output voltage of the second signal output be a preset voltage is specified as follows. When the MIPI output enable input of the LVDS signal output module 30 is enabled and output enable inputs of the first and second CMOS signal output modules 10 and 20 are both disabled, the first and second pull-down modules 40 and 50 are in active state accordingly, the LVDS signal output module 30 outputs the current signal to the second pull-down module 50 according to the logic control signal of logic 0 inputted into the data input of the LVDS signal output module 30, the second pull-down module 50 makes the voltage of the second signal output be a second preset voltage according to the current signal, and the first signal output is grounded.

The embodiment of the present invention can not only achieve the MIPI HS Mode output through the first and second signal outputs, but can also achieve the CMOS signal output through the first and second signal outputs.

Specifically, when the MIPI and LVDS output enable inputs of the LVDS signal output module 30 are disabled and output enable inputs of the first and second CMOS signal output modules 10 and 20 are both enabled, the first and second CMOS signal output modules 10 and 20 output CMOS signals respectively.

Since the MIPI output enable input is disabled at this moment, the LVDS signal output module 30 is in high impedance state and the first and second pull-down modules 40 and 50 are in closed state. By setting the signals inputted into the data inputs of the first and second CMOS signal output modules 10 and 20, the first and second CMOS signal output modules 10 and 20 are capable of outputting CMOS signals.

Further, when the MIPI output enable input of the LVDS signal output module 30 is disabled, the LVDS output enable input of the LVDS signal input module 30 is enabled and output enable inputs of the first and second CMOS signal output modules 10 and 20 are both disabled, the LVDS signal output module 30 outputs an LVDS signal.

Regarding the LVDS signal output module 30, specifically as shown in FIG. 8, it comprises a first controlled switch SW21, a second controlled switch SW11, a third controlled switch SW12 and a fourth controlled switch SW22. An input of the first controlled switch SW21 connected with an input of the second controlled switch SW11 services as the MIPI output enable input of the LVDS signal output module 30. An output of the first controlled switch SW21 connected with an input of the third controlled switch SW12 services as the second signal output of the LVDS signal output module 30. An output of the second controlled switch SW11 connected with an input of the fourth controlled switch SW22 services as the first signal output of the LVDS signal output module 30. An output of the third controlled switch SW12 and an input of the fourth controlled switch SW22 are grounded. The first, second, third and fourth controlled switches SW21, SW11, SW12 and SW22 are in on or off state according to the logic control signal.

The MIPI and LVDS output enable inputs are both provided with a supply voltage VDD. The logic control signal is inputted into control terminals of the first, second, third and fourth controlled switches SW21, SW11, SW12 and SW22.

When the logic control signal of logic 1 is inputted into the data input of the LVDS signal output module 30, the second and third controlled switches SW11 and SW12 are in on state, and the first and fourth controlled switches SW21 and SW22 are in off state.

When the logic control signal of logic 0 is inputted into the data input of the LVDS signal output module 30, the second and third controlled switches SW11 and SW12 are in off state, and the first and fourth controlled switches SW21 and SW22 are in on state.

Figure 9:
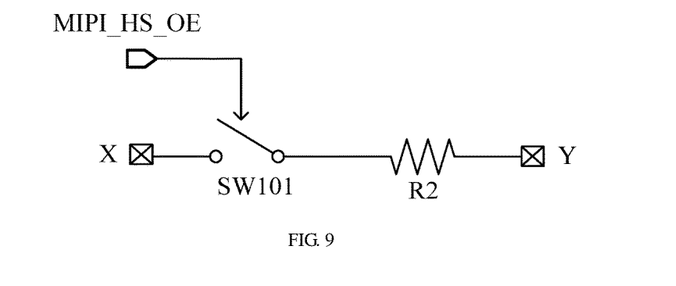
FIG. 9 is a structural diagram of a first pull-down module in the general purpose interface circuit compatible with output of MIPI signals according to an embodiment of the present invention.

Regarding the first pull-down module 40, specifically as shown in FIG. 9, it comprises a fifth controlled switch SW101 and a first pull-down resistor R2. An input of the fifth controlled switch SW101 is the signal input of the first pull-down module 40. A control terminal of the fifth controlled switch SW101 is the control terminal of the first pull-down module 40. An output of the fifth controlled switch SW101 is connected to one terminal of the first pull-down resistor R2 and the other terminal of the first pull-down resistor R2 is grounded.

Figure 10:
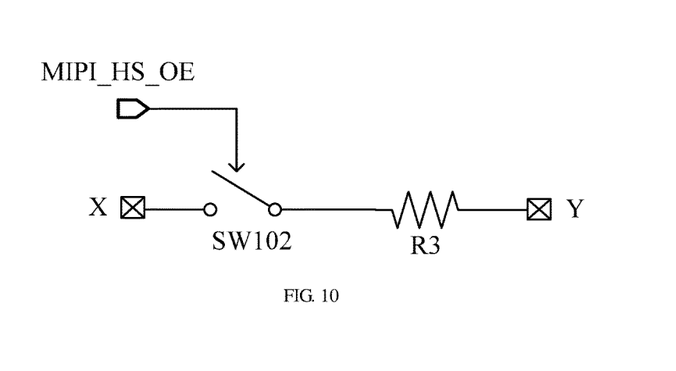
FIG. 10 is a structural diagram of a second pull-down module in the general purpose interface circuit compatible with output of MIPI signals according to an embodiment of the present invention.

Regarding the second pull-down module 50, specifically as shown in FIG. 10, it comprises a sixth controlled switch SW102 and a second pull-down resistor R3. An input of the sixth controlled switch SW102 is the signal input of the second pull-down module 50. A control terminal of the sixth controlled switch SW102 is the control terminal of the second pull-down module 50. An output of the sixth controlled switch SW102 is connected to one terminal of the second pull-down resistor R3 and the other terminal of the second pull-down resistor R3 is grounded.

As shown in FIGS. 9 and 10, the MIPI_HS_OE signal controls the on/off state of both the fifth and sixth controlled switches SW101 and SW102 at the same time. When the MIPI_HS_OE signal is a high level, the fifth controlled switch SW101 in the first pull-down module 40 and the sixth controlled switch SW102 in the second pull-down module 50 are closed, and the fifth and sixth controlled switches SW101 and SW102 are respectively connected to the resistors R2 and R3 with a same resistance of RL2. When the MIPI_HS_OE signal is a low level, the fifth controlled switch SW101 in the first pull-down module 40 and the sixth controlled switch SW102 in the second pull-down module 50 are open, and hence in off state.

FIG. 6 shows a schematic view of the GPIO interface circuit having the LVDS output, in which the function of the MIPI output interface is integrated. When the terminal MIPI_HS_OE is provided with a high level and the terminals OE+ and OE− are provided with a low level, the first and second CMOS signal output modules 10 and 20 output the high impedance state, the LVDS signal output module 30 outputs the LVDS signal, and meanwhile the first and second pull-down modules 40 and 50 are closed. When the terminal D+ is provided with the logic control signal of logic 1, the constant current IL is outputted from the terminal A+, which is then grounded via the first pull-down resistor R2 of the first pull-down module 40, thus the voltage of the terminal A+ is IL*RL2; the constant current IL flows into the terminal A−, which is then grounded via the second pull-down resistor R3 of the second pull-down module 50, thus the voltage of the terminal A− is pulled down to 0V. Accordingly, when the output logic is 1, the voltage of the terminal A+ is IL*RL2 while the voltage of the terminal A− is 0. When the terminal D+ is provided with the logic control signal of logic 0, the constant current IL is outputted from the terminal A−, which is then grounded via the second pull-down resistor R3 of the second pull-down module 50, thus the voltage of the terminal A− is IL*RL2; the constant current IL flows into the terminal A+, which is then grounded via the first pull-down resistor R2 of the first pull-down module 40, thus the voltage of the terminal A+ is pulled down to 0V. Accordingly, when the output logic is 0, the voltage of the terminal A− is IL*RL2 while the voltage of the terminal A+ is 0.

By setting the value of the current value IL and resistance RL2, the voltage IL*RL2 can satisfy the logic high voltage required by the MIPI HS Mode (usually 300 mV~400 mV). In this case, when the terminal MIPI_HS_OE is provided with a high level and the terminals OE+ and OE− are provided with a low level, the terminals A+ and A− are capable of outputting the signal level required by the MIPI HS Mode.

When the terminal MIPI_HS_OE is provided with a low level and the terminals OE+ and OE− are provided with a high level, the LVDS signal output module 30 outputs the high impedance state, the first and second CMOS signal output modules 10 and 20 output the CMOS signals. The voltage difference between the first and second CMOS signal output modules 10 and 20 is set to be 1.2V, and the D+ signal is inputted into the first CMOS signal output module 10 and the D− reverse signal is inputted into the second CMOS signal output module 20, thus the first and second CMOS signal output modules 10 and 20 output the LVCMOS12 differential signal which satisfies the requirement of the MIPI LP Mode.

According to above analysis, in the GPIO interface circuit having the LVDS output and integrated with the function of the MIPI output interface as shown in FIG. 6, this circuit can achieve MIPI HS Mode output by providing the terminal MIPI_HS_OE with a high level and the terminals OE+ and OE− with a low level through inputting control signals; and this circuit can achieve MIPI LP Mode output by providing the terminal MIPI_HS_OE with a low level and the terminals OE+ and OE− with a high level. Therefore, the GPIO interface circuit shown in FIG. 6 can support with output of MIPI signals. When the terminal MIPI_HS_OE is provided with a low level, the GPIO interface circuit is still capable of outputting CMOS signals and LVDS signals.

While above-mentioned specification is for the purpose of describing the present invention in detail combined with specific preferred embodiments, the present invention is not limited to the above-mentioned specification. Under the teaching of the present application, those of ordinary skills in the art can also make many equivalent substitutions and obvious variations of the same function or usage as that of the present invention without breaking away from the subject of the present application. All these equivalent substitutions and obvious variations belong to the protection of the claims.

What is claimed is:

1. A GPIO (general purpose input/output) interface circuit compatible with output of MIPI (Mobile Industry Processer Interface) signals, comprising:
    a first CMOS signal output module having an output enable input and a data input;
    an LVDS signal output module having an LVDS output enable input, an MIPI output enable input and a data input;
    a second CMOS signal output module having an output enable input and a data input;
    a first pull-down module; and
    a second pull-down module;
    wherein the data input of the first CMOS signal output module is connected to the data input of the LVDS signal output module; a signal output of the first CMOS signal output module is connected to a first signal output of the LVDS signal output module; a signal output of the second CMOS signal output module is connected to a second signal output of the LVDS signal output module; the MIPI output enable input is connected to a control terminal of the first pull-down module and a control terminal of the second pull-down module respectively; a signal input of the first pull-down module is connected to the first signal output of the LVDS signal output module; a signal output of the first pull-down module is grounded; a signal input of the second pull-down module is connected to the second signal output of the LVDS signal output module; and a signal output of the second pull-down module is grounded; and
    when the MIPI output enable input of the LVDS signal output module is enabled and output enable inputs of the first and second CMOS signal output modules are both disabled, the first and second pull-down modules are in active state accordingly, and the LVDS signal output module outputs a current signal to the first or second pull-down module according to a logic control signal inputted into the data input of the LVDS signal output module to ensure voltages of the first and second signal outputs be preset voltages respectively.

2. The GPIO interface circuit according to claim 1, wherein when the MIPI output enable input of the LVDS signal output module is enabled and output enable inputs of the first and second CMOS signal output modules are both disabled, the first and second pull-down modules are in active state accordingly, the LVDS signal output module outputs the current signal to the first pull-down module according to the logic control signal of logic 1 inputted into the data input of the LVDS signal output module, the first pull-down module makes voltage of the first signal output be a first preset voltage according to the current signal, and the second signal output is grounded.

3. The GPIO interface circuit according to claim 2, wherein the first pull-down module comprises a fifth controlled switch and a first pull-down resistor; an input of the fifth controlled switch is the signal input of the first pull-down module; a control terminal of the fifth controlled switch is the control terminal of the first pull-down module; and an output of the fifth controlled switch is connected to one terminal of the first pull-down resistor and the other terminal of the first pull-down resistor is grounded.

4. The GPIO interface circuit according to claim 2, wherein the second pull-down module comprises a sixth controlled switch and a second pull-down resistor; an input of the sixth controlled switch is the signal input of the second pull-down module; a control terminal of the sixth controlled switch is the control terminal of the second pull-down module; and an output of the sixth controlled switch is connected to one terminal of the second pull-down resistor and the other terminal of the second pull-down resistor is grounded.

5. The GPIO interface circuit according to claim 1, wherein when the MIPI output enable input of the LVDS signal output module is enabled and output enable inputs of the first and second CMOS signal output modules are both disabled, the first and second pull-down modules are in active state accordingly, the LVDS signal output module outputs the current signal to the second pull-down module according to the logic control signal of logic 0 inputted into the data input of the LVDS signal output module, the second pull-down module makes voltage of the second signal output be a second preset voltage according to the current signal, and the first signal output is grounded.

6. The GPIO interface circuit according to claim 5, wherein the first pull-down module comprises a fifth controlled switch and a first pull-down resistor; an input of the fifth controlled switch is the signal input of the first pull-down module; a control terminal of the fifth controlled switch is the control terminal of the first pull-down module; and an output of the fifth controlled switch is connected to one terminal of the first pull-down resistor and the other terminal of the first pull-down resistor is grounded.

7. The GPIO interface circuit according to claim 5, wherein the second pull-down module comprises a sixth controlled switch and a second pull-down resistor; an input of the sixth controlled switch is the signal input of the second pull-down module; a control terminal of the sixth controlled switch is the control terminal of the second pull-down module; and an output of the sixth controlled switch is connected to one terminal of the second pull-down resistor and the other terminal of the second pull-down resistor is grounded.

8. The GPIO interface circuit according to claim 1, wherein when the MIPI and the LVDS output enable inputs of the LVDS signal output module are both disabled and output enable inputs of the first and second CMOS signal output modules are both enabled, the first and second CMOS signal output modules output CMOS signals respectively.

9. The GPIO interface circuit according to claim 8, wherein the first pull-down module comprises a fifth controlled switch and a first pull-down resistor; an input of the fifth controlled switch is the signal input of the first pull-down module; a control terminal of the fifth controlled switch is the control terminal of the first pull-down module; and an output of the fifth controlled switch is connected to one terminal of the first pull-down resistor and the other terminal of the first pull-down resistor is grounded.

10. The GPIO interface circuit according to claim 8, wherein the second pull-down module comprises a sixth controlled switch and a second pull-down resistor; an input of the sixth controlled switch is the signal input of the second pull-down module; a control terminal of the sixth controlled switch is the control terminal of the second pull-down module; and an output of the sixth controlled switch is connected to one terminal of the second pull-down resistor and the other terminal of the second pull-down resistor is grounded.

11. The GPIO interface circuit according to claim 1, wherein when the MIPI output enable input of the LVDS signal output module is disabled, the LVDS output enable input of the LVDS signal input module is enabled and output enable inputs of the first and second CMOS signal output modules are both disabled, the LVDS signal output module outputs an LVDS signal.

12. The GPIO interface circuit according to claim 11, wherein the first pull-down module comprises a fifth controlled switch and a first pull-down resistor; an input of the fifth controlled switch is the signal input of the first pull-down module; a control terminal of the fifth controlled switch is the control terminal of the first pull-down module; and an output of the fifth controlled switch is connected to one terminal of the first pull-down resistor and the other terminal of the first pull-down resistor is grounded.

13. The GPIO interface circuit according to claim 11, wherein the second pull-down module comprises a sixth controlled switch and a second pull-down resistor; an input of the sixth controlled switch is the signal input of the second pull-down module; a control terminal of the sixth controlled switch is the control terminal of the second pull-down module; and an output of the sixth controlled switch is connected to one terminal of the second pull-down resistor and the other terminal of the second pull-down resistor is grounded.

14. The GPIO interface circuit according to claim 1, wherein the LVDS signal output module comprises a first controlled switch, a second controlled switch, a third controlled switch and a fourth controlled switch; an input of the first controlled switch connected with an input of the second controlled switch services as the MIPI output enable input of the LVDS signal output module; an output of the first controlled switch connected with an input of the third controlled switch services as the second signal output of the LVDS signal output module; an output of the second controlled switch connected with an input of the fourth controlled switch services as the first signal output of the LVDS signal output module; an output of the third controlled switch and an input of the fourth controlled switch are grounded; and the first, second, third and fourth controlled switches are in on or off state according to the logic control signal.

15. The GPIO interface circuit according to claim 14, wherein when the logic control signal of logic 1 is inputted into the data input of the LVDS signal output module, the second and third controlled switches are in on state, and the first and fourth controlled switches are in off state.

16. The GPIO interface circuit according to claim 14, wherein when the logic control signal of logic 0 is inputted into the data input of the LVDS signal output module, the second and third controlled switches are in off state, and the first and fourth controlled switches are in on state.

17. The GPIO interface circuit according to claim 1, wherein the first pull-down module comprises a fifth controlled switch and a first pull-down resistor; an input of the fifth controlled switch is the signal input of the first pull-down module; a control terminal of the fifth controlled switch is the control terminal of the first pull-down module; and an output of the fifth controlled switch is connected to one terminal of the first pull-down resistor and the other terminal of the first pull-down resistor is grounded.

18. The GPIO interface circuit according to claim 1, wherein the second pull-down module comprises a sixth controlled switch and a second pull-down resistor; an input of the sixth controlled switch is the signal input of the second pull-down module; a control terminal of the sixth controlled switch is the control terminal of the second pull-down module; and an output of the sixth controlled switch is connected to one terminal of the second pull-down resistor and the other terminal of the second pull-down resistor is grounded.

\* \* \* \* \*